US007095802B1

(12) United States Patent
Wardrop et al.

(10) Patent No.: US 7,095,802 B1
(45) Date of Patent: Aug. 22, 2006

(54) APPARATUS AND METHOD FOR GPS-BASED DIGITAL COMPENSATION OF RADIO FREQUENCIES

(75) Inventors: Andrew J. Wardrop, Lakeville, MN (US); Stephen W. Fuchs, Victoria, MN (US)

(73) Assignee: General Dynamics Advanced Information Systems, Inc., Arlington, VA (US)

( * ) Notice: Subject to any disclaimer, the term of this patent is extended or adjusted under 35 U.S.C. 154(b) by 879 days.

(21) Appl. No.: 09/726,978

(22) Filed: Nov. 30, 2000

(51) Int. Cl.
*H03K 9/00* (2006.01)

(52) U.S. Cl. .................. 375/316; 375/130; 375/222; 375/219; 375/295; 331/17; 342/357.12

(58) Field of Classification Search ............... 375/149, 375/219, 259, 285, 295, 316, 344, 358, 130; 348/470, 608; 342/357.12, 18; 701/214; 331/17; 714/712
See application file for complete search history.

(56) References Cited

U.S. PATENT DOCUMENTS

| 5,528,199 | A | * | 6/1996 | Dunlop et al. ............. 331/17 |
| 5,748,677 | A | * | 5/1998 | Kumar .................. 375/285 |
| 5,861,842 | A | | 1/1999 | Hitch et al. ............... 342/357 |
| 5,867,535 | A | * | 2/1999 | Phillips et al. ............ 375/295 |
| 5,886,583 | A | | 3/1999 | Horiuchi .................. 331/11 |
| 6,246,960 | B1 | * | 6/2001 | Lin ....................... 701/214 |
| 6,307,877 | B1 | * | 10/2001 | Philips et al. ............. 375/130 |

* cited by examiner

*Primary Examiner*—Khai Tran
*Assistant Examiner*—Edith Chang
(74) *Attorney, Agent, or Firm*—Steptoe & Johnson LLP (57) ABSTRACT

An apparatus and method for controlling the communication frequencies of a software controlled radio by using GPS to calibrate one or more local oscillators and compensating within the digital radio processing for the local oscillator inaccuracies.

11 Claims, 5 Drawing Sheets

APPARATUS AND METHOD FOR GPS-BASED DIGITAL COMPENSATION OF RADIO FREQUENCIES

BACKGROUND OF THE INVENTION

1 Field of the Invention

The present invention relates to software controlled radios and, more particularly, to Global Positioning System-based digital compensation of radio frequencies used in software controlled radios.

2. Description of the Related Art

The use of software controlled radios has increased substantially in recent times. Software controlled radios are used in applications including wireless digital telephones, digital televisions, and numerous other forms of wireless digital data transfers. When generating and receiving radio signals, precise frequency control is needed to define communication channels and to stay within regulatory limits. The precise control of radio frequencies allows for a more efficient use of the radio spectrum by minimizing the amount of deadband needed between radio channels to accommodate frequency tolerances.

Conventional software controlled radio systems generally use high quality, temperature stabilized, crystal oscillators to control the radio frequencies used. In extreme cases, atomic clocks may be used to control these radio frequencies. These methods of radio frequency control generally are more expensive and consume more power than the use of simple crystal oscillators.

The Global Positioning System's (GPS) one-pulse-per-second (PPS) signal has been used to directly stabilize the frequency of an oscillator. While this system uses GPS to measure the frequency error, it uses analog techniques to alter the oscillator frequency and make the frequency precisely correct. Consequently, this system still generally requires the use of high cost oscillators to achieve precise frequency control.

Therefore, it would be desirable to have an apparatus and method for controlling the communication frequencies of a software controlled radio by using GPS signals to measure the inaccuracies of one or more local oscillators and then digitally compensating within the software controlled radio for the local oscillator inaccuracies.

SUMMARY OF THE INVENTION

The present invention is an apparatus and method for controlling the communication frequencies of a software controlled radio by using GPS PPS signals to calibrate one or more local oscillators and then digitally compensating within the software controlled radio for the local oscillator inaccuracies. The present invention provides precise frequency control of the radio frequencies used by software controlled radios that is traceable to international time and frequency standards and that uses low cost components.

A software controlled radio according to a preferred embodiment of the present invention comprises a receiver chain, a data consumer/generator, and a transmitter chain. The receiver preferably comprises a downconverter, an analog to digital converter, a digital receiver, and a demodulator. The one or more local oscillators that are used to drive the components of the receiver chain preferably are monitored by one or more frequency monitors that measure the frequency of the local oscillators using a GPS PPS. The one or more frequency monitors preferably provide the frequency measurements of the one or more local oscillators to a computer that preferably calculates both the frequency error of the one or more local oscillators and a numerically controlled oscillator (NCO) setting to compensate for the local oscillator errors. The NCO setting provided by the computer permits a desired center channel radio frequency to be selected by the digital receiver, despite the inaccuracies of the local oscillator frequencies.

The transmitter chain according to the present invention preferably comprises a digital modulator, a digital to analog converter, and an upconverter. The use of frequency monitors in the transmitter chain is analogous to the use of frequency monitors in the transmitter chain. That is, the one or more local oscillators that are used to drive the components of the transmitter chain preferably are monitored by one or more frequency monitors that measure the frequency of the local oscillators using a GPS PPS signal. The one or more frequency monitors preferably provide the frequency measurements of the one or more local oscillators to a computer that preferably calculates both the error of the one or more local oscillators and a numerically controlled oscillator (NCO) setting to compensate for the local oscillator errors. The NCO setting provided by the computer permits a desired center channel radio frequency to be transmitted from the upconverter, despite the inaccuracies of the local oscillator frequencies.

In a preferred embodiment of the present invention, one computer is used to calculate both (1) the errors from both the one or more local oscillators used in the receiver chain and the one or more local oscillators used in the transmitter chain and (2) the NCO settings for both the receiver chain and the transmitter chain. In this embodiment, the computer and the frequency monitors for both the receiver chain and the transmitter chain may be incorporated into a single component.

DETAILED DESCRIPTION OF THE PREFERRED EMBODIMENT

Figure 1:
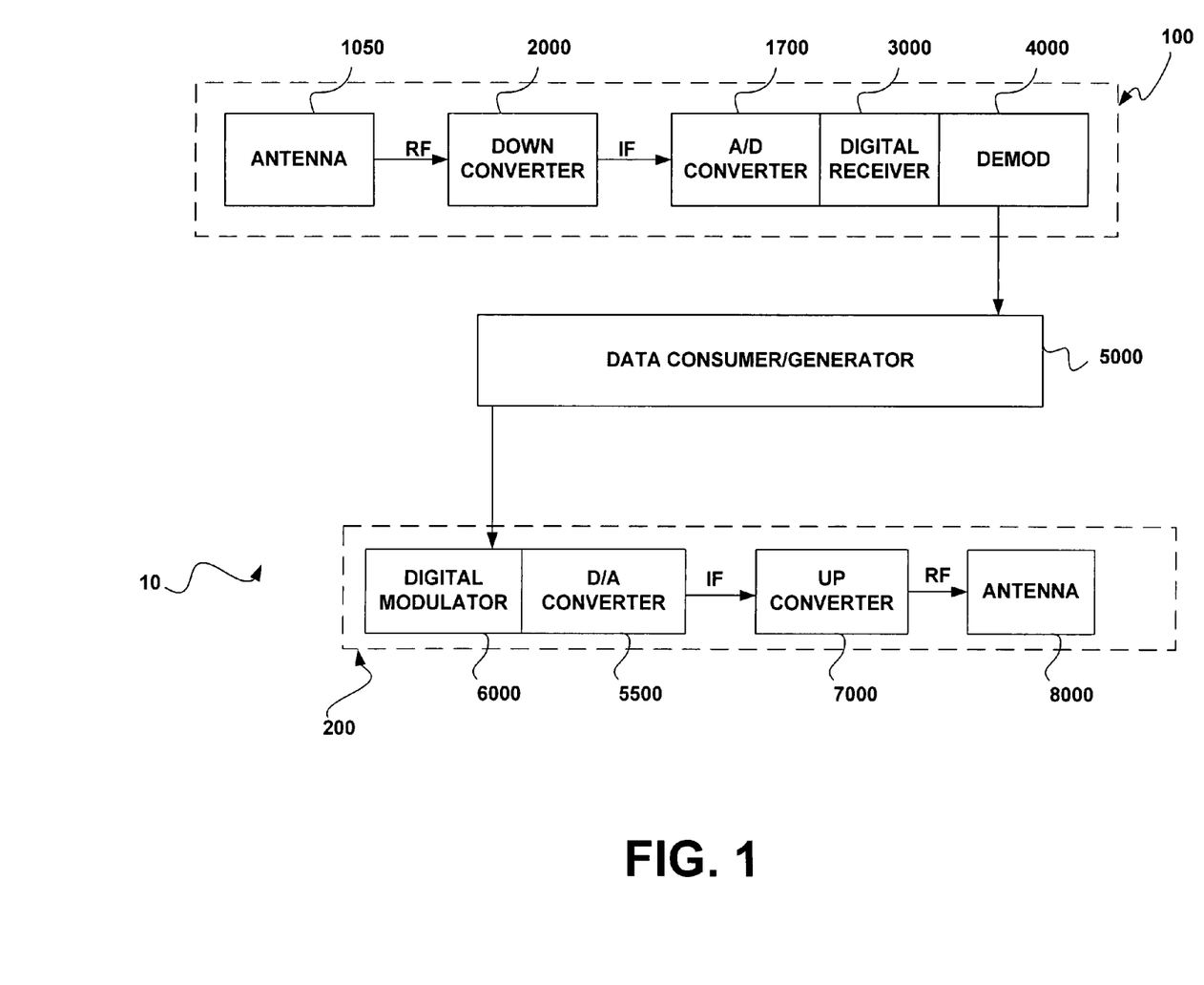
FIG. 1 is an overall schematic diagram of a software controlled radio according to the present invention.

The present invention is a method and apparatus for controlling the communication frequencies of a software controlled radio by using GPS signals to calibrate one or more local oscillators and then digitally compensating within the software controlled radio for the local oscillator inaccuracies. As shown in FIG. 1, a software controlled radio 10 according to the present invention has several components. Software controlled radio 10 preferably includes a receiver chain 100 comprising a receiver antenna 1050, a downconverter 2000, an analog-to-digital (A/D) converter 1700, a digital receiver 3000, and a demodulator 4000; a data consumer/generator 5000; and a transmitter chain 200 comprising a digital modulator 6000, a digital-to-analog (D/A) converter 5500, an upconverter 7000, and a transmitter antenna 8000.

Of the foregoing components, downconverter 2000, upconverter 7000, digital receiver 3000, and/or digital modulator 6000 have been known to affect the final radio frequencies used by software controlled radio 10. Conventional systems generally control the frequencies used by these components through the use of high quality, temperature-stabilized, crystal oscillators. In extreme circumstances, a conventional system may use an atomic clock to control the frequencies used by these components. Such temperature-stabilized crystal oscillators or atomic clocks generally are more expensive and consume more power than simple crystal oscillators.

Referring to FIGS. 2A, 2B, 3A, and 3B, the present invention can use simple oscillators, rather than temperature-stabilized crystal oscillators or atomic clocks, to control the frequency used by software controlled radio 10. The present invention can continuously calibrate these simple oscillators using GPS signals and can use the extreme flexibility of the mixing stages in digital receiver 3000 and digital modulator 6000 to precisely compensate for the inaccuracies of the local oscillators. This use of GPS signals according to the present invention can produce a precise frequency control that is traceable through the GPS signal to international timing and frequency standards. A high degree of accuracy allows for a more efficient use of the radio spectrum by minimizing the amount of deadband needed between radio channels to accommodate frequency tolerances.

Data consumer/generator 5000 may be any component that receives and/or transmits data including, without limitation, a computer interface, a data router or data switch, a digital-to-voice converter or voice-to-digital converter, a digital television receiver or digital television transmitter, and any other device that receives or transmits digital information. Receiver chain 100 and transmitter chain 200 are described in further detail below.

1. Receiver Chain

Figure 2A:
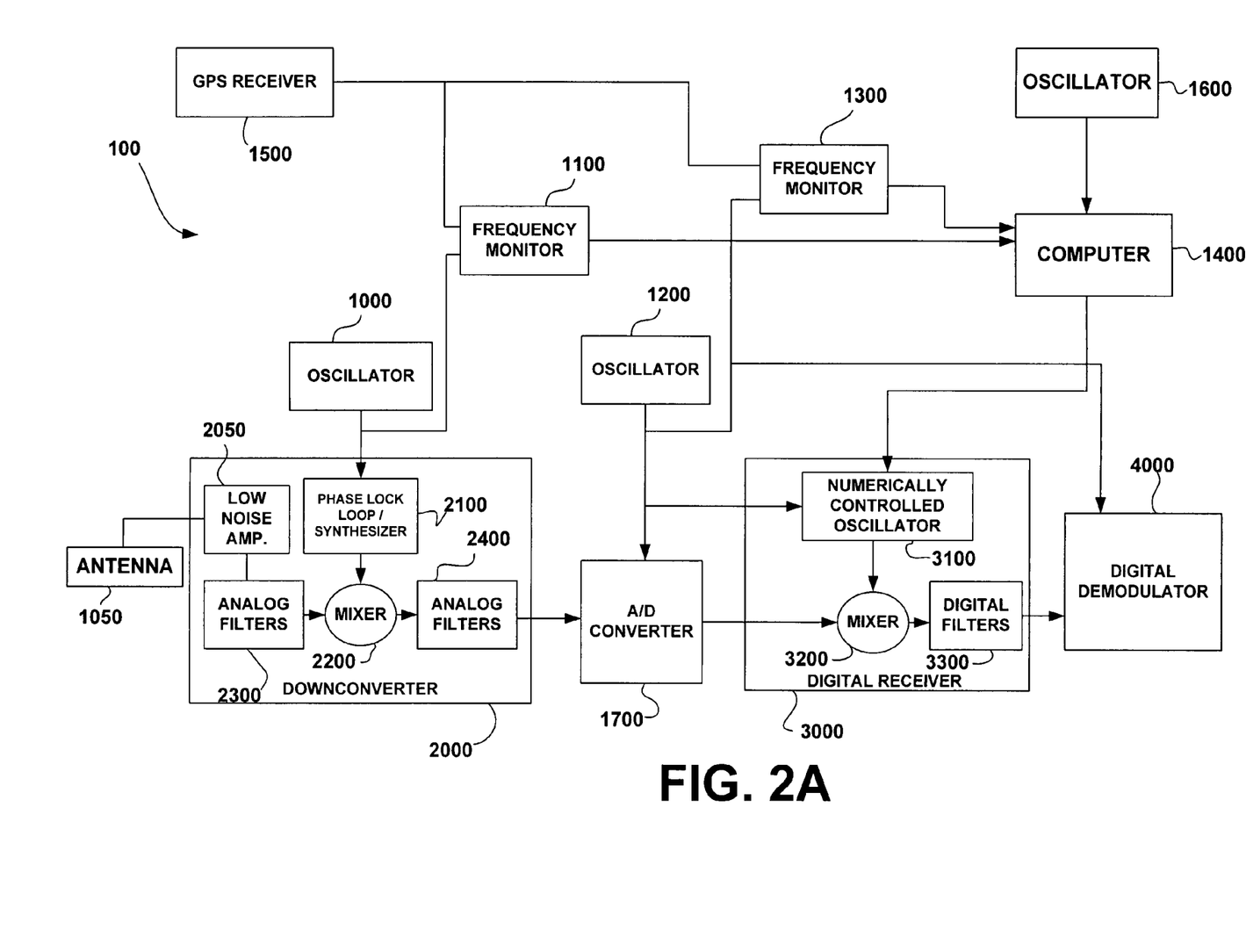
FIG. 2A is a schematic diagram of a receiver chain of a software controlled radio according to the present invention.
Figure 2B:
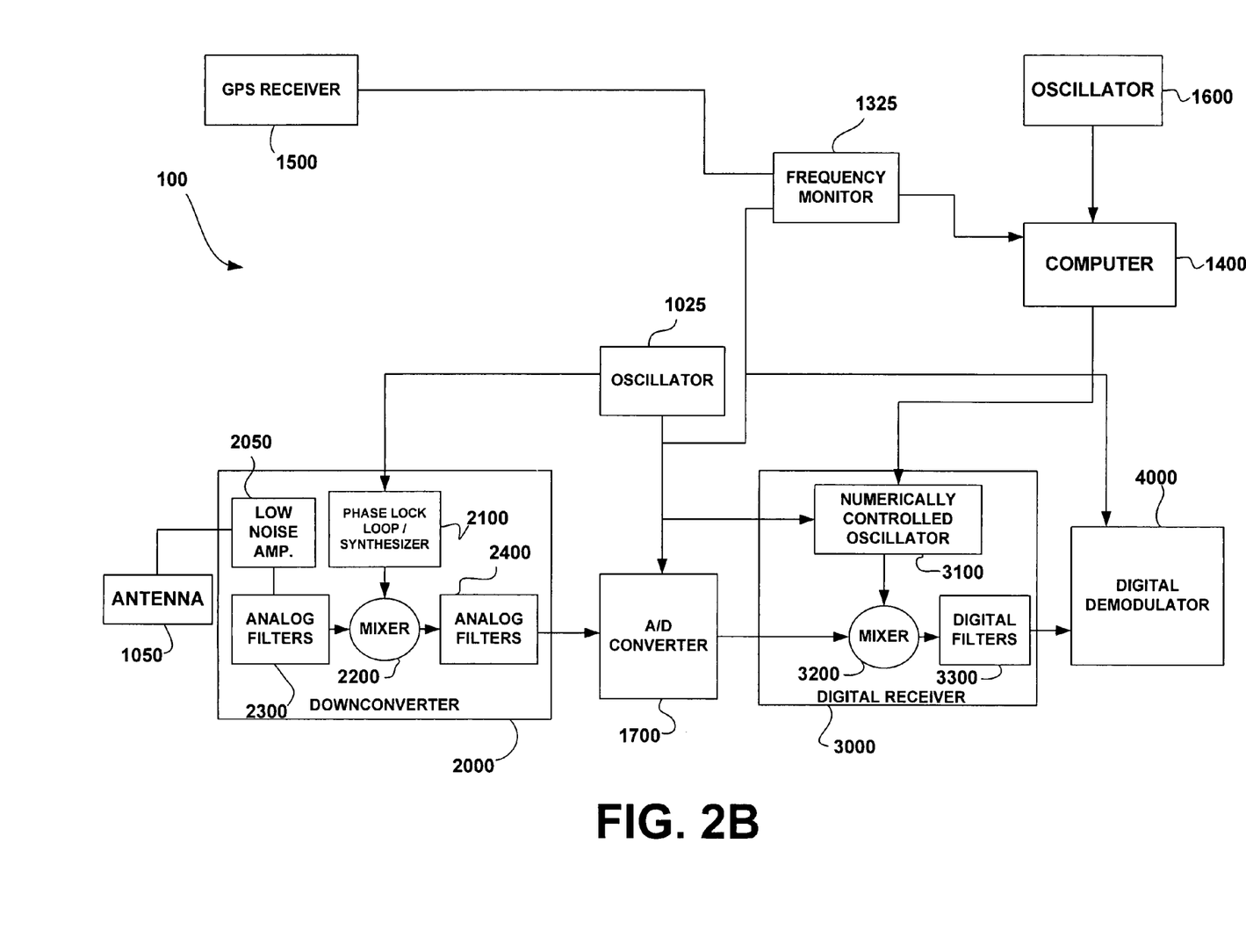
FIG. 2B is a schematic diagram of an alternate receiver chain of a software controlled radio according to the present invention.

FIGS. 2A and 2B illustrate two embodiments of a receiver chain 100 according to the present invention. Receiver chain 100 preferably comprises antenna 1050, downconverter 2000, A/D converter 1700, digital receiver 3000, and digital demodulator 4000. Downconverter 2000 reduces the signal of interest received by antenna 1050 to an intermediate frequency (IF). The signal is then digitized by A/D converter 1700. Digital receiver 3000 is used to select a particular channel and demodulator 4000 is used to reduce the signal to digital information.

In a preferred embodiment of the present invention, downconverter 2000 can be a separate physical unit from A/D converter 1700, digital receiver 3000, and digital demodulator 4000. In this embodiment, as shown in FIG. 2A, oscillator 1000 supplies a clock signal to downconverter 2000, and oscillator 1200 supplies a clock signal to A/D converter 1700, digital receiver 3000, and digital demodulator 4000. Alternatively, as shown in FIG. 213, a single oscillator 1025 may be used in lieu of oscillators 1000 and 1200 to supply a clock signal to downconverter 2000, A/D converter 1700, digital receiver 3000, and digital demodulator 4000.

In another embodiment of the present invention (not shown), downconverter 2000 may be part of the same physical unit as A/D converter 1700, digital receiver 3000, and digital demodulator 4000. In this embodiment, a single oscillator can be used to supply a clock signal to downconverter 2000, A/D converter 1700, digital receiver 3000, and digital demodulator 4000; or a first oscillator can be used to supply a clock signal to downconverter 2000, and oscillator 1200 may be used to supply a clock signal to A/D converter 1700, digital receiver 3000, and digital demodulator 4000, as described above.

A. Downconverter

As shown in FIG. 2A, downconverter 2000 preferably comprises a low noise amplifier 2050, a phase lock loop/synthesizer 2100, a mixer 2200, an anti-aliasing low pass filter 2300, and an image removal filter 2400. In one embodiment of the present invention, as shown in FIG. 2A, downconverter 2000 may be driven by clock signals generated by oscillator 1000. Alternatively, as shown in FIG. 2B, downconverter 2000 can be driven by a clock signal generated by oscillator 1025.

Referring to FIG. 2A, the clock signal generated by oscillator 1000 preferably is multiplied by phase lock loop/synthesizer 2100 which, in turn provides to mixer 2200 the proper frequency for mixing with a RF input signal received by an antenna 1050. Phase lock loop/synthesizer 2100 preferably generates a mixing frequency that is a precise ratio to an input clock signal generated by oscillator 1000. Any frequency inaccuracies in the clock signal generated by oscillator 1000 will be reflected in the output of downconverter 2000. Depending upon the system design, phase lock loop/synthesizer 2100 either may be set for a fixed ratio or may be programmable.

In a preferred embodiment of the present invention, downconverter 2000 is supplied by L3 Communications, Conic Division, 9020 Balboa Avenue, San Diego, Calif. 92133. Alternatively, any downconverter suitable for use with a software controlled radio may be used as downconverter 2000.

In another embodiment of the present invention (not shown), phase lock loop/synthesizer 2100, mixer 2200, and either filter 2300 or filter 2400 may be eliminated using a technique known as direct digital downconversion. In this embodiment, oscillator 1000 would neither be required nor used.

B. Analog-to-Digital Converter

A/D converter 1700 preferably is used to convert the analog output from downconverter 2000 into digital output. The output from downconverter 2000 can be a wide frequency band that can contain many radio channels. A/D converter 1700 preferably operates using clock signals generated by oscillator 1200 or 1025, as illustrated in FIGS. 2A and 2B, respectively, but can operate using clock signals generated by any suitable source as would be known to those skilled in the art. In a preferred embodiment of the present invention, A/D converter 1700 is model no. AD6644 available from Analog Devices, Inc., One Technology Way, P.O. Box 9106, Norwood, Mass. 02062-9106. Alternatively, A/D converter 1700 can be any analog to digital converter suitable for use in a software controlled radio.

C. Digital Receiver

Digital receiver 3000 preferably is used to precisely select a radio channel that is characterized by its center frequency and bandwidth. Digital receiver 3000 preferably comprises a numerically controlled oscillator (NCO) 3100, a mixer 3200, and a digital filter 3300. To select the desired radio channel, digital receiver 3000 preferably generates a mixing frequency in NCO 3100. This mixing frequency can be mixed with an incoming digitized waveform provided by A/D converter 1700. After the mixing frequency is mixed with the incoming digitized waveform, digital receiver 3000 preferably band limits the mixed signal in digital filter 3300.

NCO 3100 preferably allows the mixing frequency to be precisely controlled. However, NCO 3100 preferably is driven by clock signals generated by oscillator 1200 or 1025, as illustrated in FIGS. 2A and 2B, respectively, and, therefore, its accuracy generally is limited to that of oscillator 1200 or 1025.

In a preferred embodiment of the present invention, digital receiver 3000 is model no. GC4016, available from Graychip, Inc., 2185 Park Blvd., Palo Alto, Calif. 94306. In other embodiments, digital receiver 3000 can be model no. HSP 50216, available from Intersil Corp., P.O. Box 886, Mail Stop 53-204, Melbourne, Fla. 32902 or model no. AD6624, available from Analog Devices, Inc. Alternatively, other digital receiver that is suitable for use with a software controlled radio can be used as digital receiver 3000.

D. Frequency Monitor

Referring to FIG. 2A, frequency monitor 1100 and frequency monitor 1300 preferably are used to precisely measure the output frequencies of oscillator 1000 and oscillator 1200, respectively. The output frequencies of oscillator 1000 and oscillator 1200 preferably are precisely measured to enable the present invention to digitally compensate for the inaccuracies of oscillator 1000 and oscillator 1200. Frequency monitor 1100 and frequency monitor 1300 utilize a GPS PPS signal to measure the output frequencies of oscillator 1000 and oscillator 1200.

In a preferred embodiment of the present invention, frequency monitor 1100 and frequency monitor 1300 are simple counters that count the clock pulses from oscillator 1000 and oscillator 1200. The GPS PPS signal transmitted from a GPS receiver 1500 preferably is used to start and stop the counters of frequency monitor 1100 and frequency monitor 1300. The use of the GPS PPS signal to start and stop frequency monitor 1100 and frequency monitor 1300 preferably enables frequency monitor 1100 to precisely measure the number of clock pulses generated by oscillator 1000 in one second and preferably enables frequency monitor 1300 to precisely measure the number of clock pulses generated by oscillator 1200 in one second. As an example, a typical oscillator, such as oscillator 1000 and oscillator 1200, generally will operate at a frequency of 10 MHz or greater. A one second of count of this typical oscillator will provide nominally 10,000,000 counts, thus determining accuracy to 0.1 parts-per-million.

In a preferred embodiment of the present invention, frequency monitor 1100 and frequency monitor 1300 are continuously running counters driven by the clock signal from oscillator 1000 and oscillator 1200. A capture register on frequency monitor 1100 and frequency monitor 1300 records the oscillator count from oscillator 1000 or oscillator 1200 when the PPS signal from GPS receiver 1500 is received. Successive readings preferably can be compared to deduce the number of clock signals generated during a one second time period. Various other methods for directly counting the clock signals generated by oscillator 1000 and oscillator 1200 may also be used.

In a preferred embodiment of the present invention, frequency monitor 1100 and frequency monitor 1300 preferably are performed by V20 chips available from General Dynamics Information Systems, 8800 Queen Avenue South, Bloomington, Minn. 55431. In another embodiment of the present invention, both frequency monitor 1100 and frequency monitor 1300 can be realized on a single V20 chip available from General Dynamics Information Systems. Counter timer chips available from Intel Corp., 2200. Mission College Blvd., Santa Clara, Calif. 95052, also can be used for frequency monitor 1100 and frequency monitor 1300. In addition, any other counter timer device could be used for frequency monitor 1100 and frequency monitor 1200 according to the present invention.

In another embodiment (not shown) of the present invention, a single frequency monitor can be used to measure the frequencies of oscillator 1000 and oscillator 1200. In this embodiment, the frequency monitor collects samples of the clock signals generated by oscillator 1000 and oscillator 1200 on an alternating basis using the GPS PPS signal to measure the number of clock signals generated per second. The rate at which the frequencies of the oscillators preferably is sampled is dependent upon the rate at which the frequencies of the oscillators are likely to vary. For example, when the present invention is used in an environment where the temperature changes rapidly, the frequencies of the oscillators preferably would be sampled frequently because rapid temperature changes can cause the frequencies of the oscillators to vary. On the other hand, when the present invention is used in an environment where the temperature remains constant, the frequencies of the oscillators may be sampled on a less frequent basis because the frequencies of the oscillators are less likely to vary.

In another embodiment of the present invention, the sampling technique for measuring the frequencies of oscillators 1000 and 1200 that is described above may also be used when both frequency monitor 1100 and frequency monitor 1300 are used with the present invention.

In one embodiment of the present invention, GPS receiver 1500 preferably is manufactured by L3 Communications. However, any GPS receiver capable of receiving the GPS satellite signals and producing the PPS signal including, without limitation, GPS receivers available from Honeywell, Motorola, and Laben, may be used as GPS receiver 1500.

Referring to FIG. 2B, frequency monitor 1325 can be used to measure the frequency of oscillator 1025 using any of the above described techniques.

E. Computer

Referring to FIG. 2A, the frequency measurements collected by frequency monitor 1100 and frequency monitor 1300 preferably are transmitted to computer 1400. Using these frequency measurements, computer 1400 preferably may calculate the frequency errors of oscillator 1000 and oscillator 1200, calculate the resulting error in the mixing frequency generated in downconverter 2000, and solve for the frequency setting of NCO 3100 that is needed to provide a desired radio channel center frequency that is provided by digital receiver 3000.

In one embodiment of the present invention, computer 1400 can be driven by a clock signal generated by an oscillator 1600. In another embodiment of the present invention (not shown), computer 1400 can be driven by the clock signal generated by either oscillator 1000 or oscillator 1200. In the present invention, the accuracy of the oscillator used to drive computer 1400 will not affect the radio channel center frequency that is transmitted from digital receiver 3000.

In the present invention, any computer that is suitable for calculating the frequency errors of one or more oscillators, calculating the resulting error of the mixing frequency generated in downconverter 2000, and solving for the required frequency setting of NCO 3100 can be used as computer 1400. In addition, computer 1400 can be physically located anywhere in the present invention. In one embodiment of the present invention, a V20 chip available from General Dynamics Information Systems is used as computer 1400. In this embodiment, frequency monitor 1100 and/or frequency monitor 1300 and computer 1400 can be incorporated into a single component because the V20 chip may include these components.

An example of the calculations made by computer 1400, as would be known to one skilled in the art, is shown in Table 1 below. This example uses a nominal clock rate of 10 MHz for oscillator 1000 and assumes an error of 5 parts-per-million (ppm) for oscillator 1000. In this example, oscillator 1000 would have an actual clock rate (or frequency) of 10.00005 MHz. The below example uses a nominal clock rate of 40 MHz for oscillator 1200 and assumes an error of −20 ppm for oscillator 1200. In this example, oscillator 1200 would have an actual clock rate (frequency) of 39.9992 MHz. As shown in Table 1 below, an apparatus according to the present invention having an oscillator 1000 with an error of 5 ppm and an oscillator 1200 with an error of −20 ppm would require NCO 3100 in digital receiver 3000 to be set to a value 439 ppm from nominal to select the desired RF center frequency.

TABLE 1

|  | Desired | Actual | Error |
|---|---|---|---|
| Channel Carrier | 1392 MHz | 1392.000 MHz | 0 |
| Phase lock loop/ synthesizer 2100 Frequency | 1377 MHz | 1377.006885 MHz | 5.0 ppm |
| Downconverter 2000 Intermediate Frequency (IF) Out | 15 MHz | 14.993115 MHz | −459.2 ppm |
| A/D Rate (clock speed of oscillator 1200) | 40 MHz | 39.999 MHz | −20.0 ppm |
| NCO 3100 Divider Ratio | 0.375000 | 0.374835 | −439.2 ppm |
| Effective input digital receiver 3000 frequency |  | 14.993115 MHz | 0.0 ppm |

2. Transmitter Chain

Figure 3A:
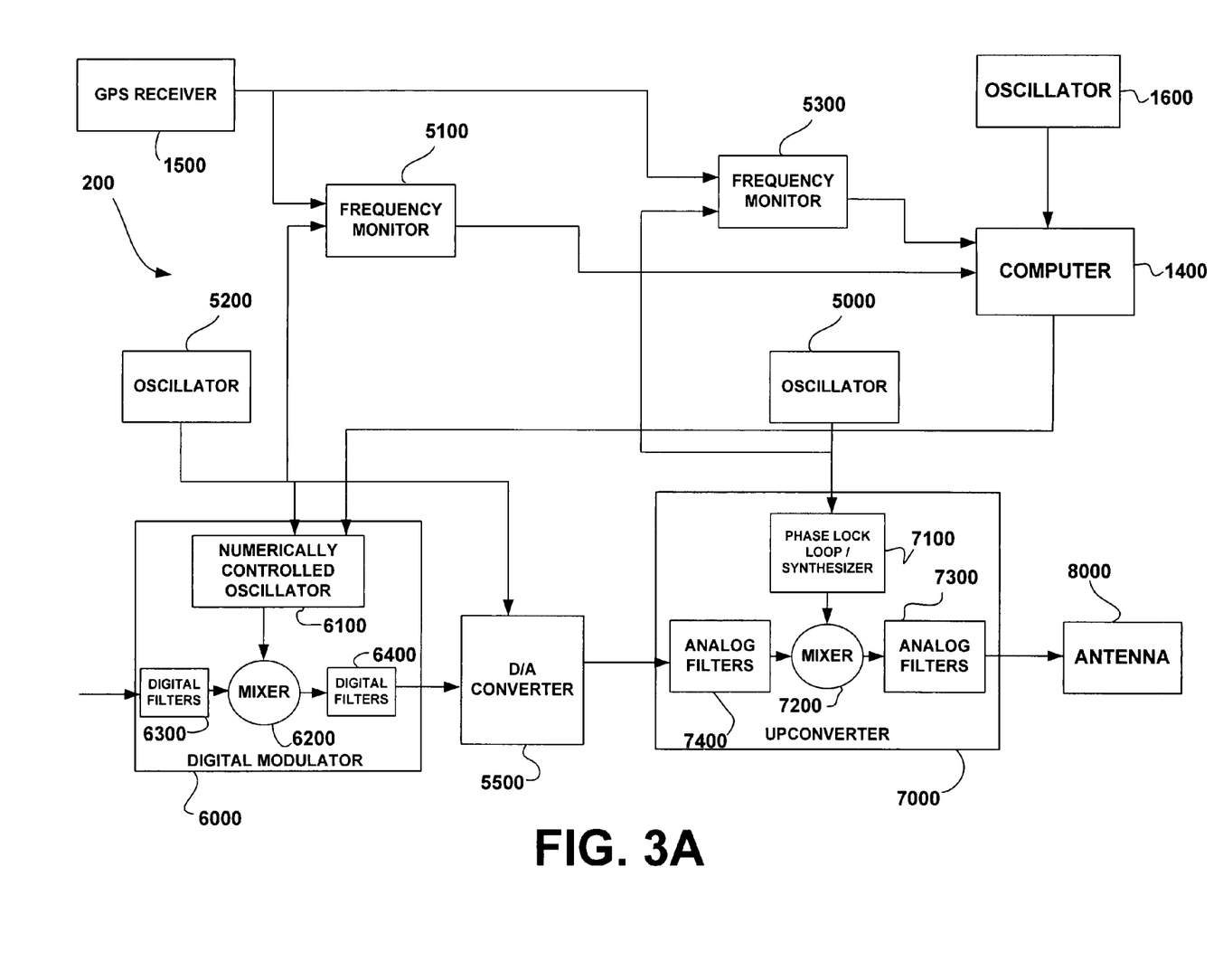
FIG. 3A is a schematic diagram of a transmitter chain of a software controlled radio according to the present invention.

Referring now to FIG. 3A, transmitter chain 200 according to the present invention is shown. Transmitter chain 200 preferably comprises digital modulator 6000, digital-to-analog (D/A) converter 5500, upconverter 7000, and antenna 8000. Digital modulator 6000 preferably receives a digital information stream transmitted from data consumer/generator 5000 and outputs a modulated intermediate frequency. The intermediate frequency generated by digital modulator 6000 preferably is then converted from a digital signal to an analog signal using D/A converter 5500. After the digital signal has been converted to an analog signal by D/A converter 5500, upconverter 7000 then preferably uses mixer 7200 to upconvert the intermediate frequency to a desired transmitting frequency. The desired transmitting frequency may then be amplified as needed and transmitted to antenna 8000. As discussed below, frequency monitor 5100 and frequency monitor 5300 preferably are used to measure the clock rates of oscillator 5200 and oscillator 5000 using a GPS PPS signal to control the frequency of the RF signal that is transmitted from transmitter chain 200.

Figure 3B:
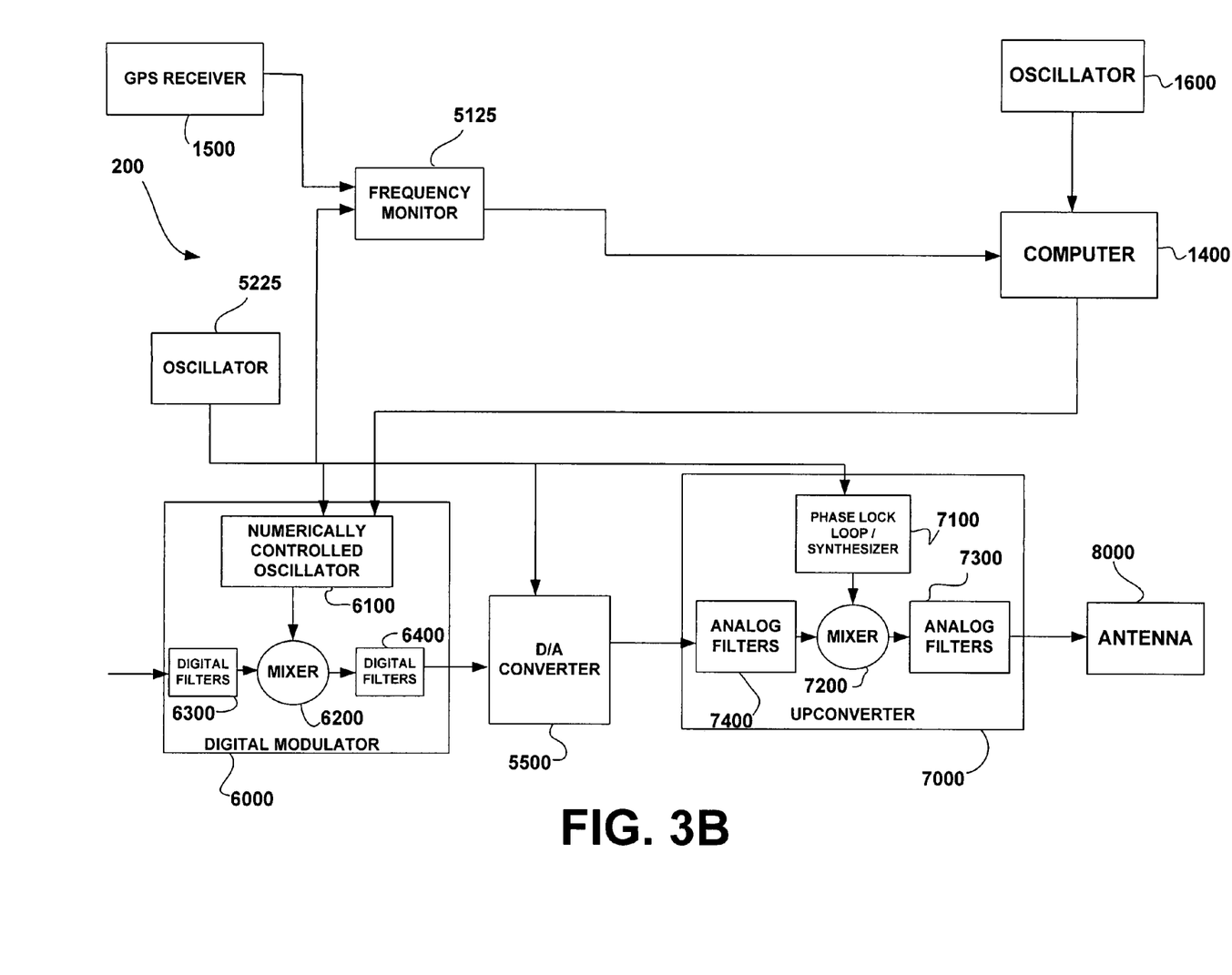
FIG. 3B is a schematic diagram of an alternate transmitter chain of a software controlled radio according to the present invention.

In an alternate embodiment of transmitter chain 200 that is shown in FIG. 3B, a single oscillator 5225 may be used in lieu of oscillators 5200 and 5000 to supply a clock signal to digital modulator 6000, D/A converter 5500, and upconverter 7000. In this embodiment, a single frequency monitor 5125 is used to measure the clock rate of oscillator 5225.

A. Digital Modulator

Referring to FIG. 3A, digital modulator 6000 preferably comprises a numerically controlled oscillator (NCO) 6100, a mixer 6200, a digital filter 6300, and a digital filter 6400. As discussed further below, NCO 6100 receives a frequency setting from computer 1400 to compensate for inaccuracies of oscillator 5000 and oscillator 5200.

In a preferred embodiment of the present invention, digital modulator 6000 may be model no. AD 6622 available from Analog Devices, Inc. Alternatively, any digital modulator that is suitable for use with a software controlled radio may be used as digital modulator 6000.

B. Digital to Analog Converter

D/A converter 5500 is used to convert the digital intermediate frequency transmitted from digital modulator 6000 into an analog intermediate frequency. D/A converter preferably operates using clock signals generated by oscillator 5200, but may operate using clock signals generated by any suitable source.

In a preferred embodiment of the present invention, D/A converter 5500 is model no. AD9754, available from Analog Devices, Inc. Alternatively, D/A converter 5500 may be any digital-to-analog converter that is suitable for use with a software controlled radio.

In a preferred embodiment of the present invention, digital modulator 6000 and D/A converter 5500 can be incorporated into the same component. In this preferred embodiment, digital modulator 6000 and D/A converter 5500 preferably are model no. AD9856 produced by Analog Devices, Inc., but may also be model no. HSP50415 produced by Intersil Corp. Alternatively, any other combined digital modulator and D/A converter that is suitable for use with a software controlled radio may be used in the present invention.

C. Upconverter

Upconverter 7000 preferably is used to upconvert the analog intermediate frequency transmitted from D/A converter 5500 to a desired transmission frequency that will be transmitted to antenna 8000. In one embodiment of the present invention, upconverter 7000 is driven by clock signals generated by oscillator 5000. Upconverter 7000 may also be driven by a clock signal generated by oscillator 5200 or any other clock signal source. Phase lock loop/synthesizer 7100 preferably generates a mixing frequency that is a precise ratio to an input clock signal generated by oscillator 5000. Any frequency inaccuracies in the clock signal generated by oscillator 5000 will be reflected in the output of upconverter 7000. Depending upon the system design, phase lock loop/synthesizer 7100 either can be set for a fixed ratio or can be programmable. A power amplifier can be incorporated into upconverter 7000 if needed.

In a preferred embodiment of the present invention, upconverter 7000 is a separate physical unit from digital modulator 6000 and D/A converter 5500 and is driven by oscillator 5000. In another embodiment (not shown), upconverter 7000 may be incorporated into the same physical unit as digital modulator 6000 and D/A converter 5500. In this embodiment, upconverter 7000, digital modulator 6000, and D/A converter 5500 can all be driven by a single oscillator.

In one embodiment of the present invention, upconverter 7000 may be supplied by L3 Communications, Conic Division. Alternatively, any upconverter suitable for use with a software controlled radio may be used as upconverter 7000.

D. Frequency Monitor

Referring to FIG. 3A, frequency monitor 5100 and frequency monitor 5300 preferably are used to precisely measure the output frequencies of oscillator 5200 and oscillator 5000, respectively, to enable the present invention to digitally compensate for the inaccuracies of oscillator 5200 and oscillator 5000. Referring to FIG. 3A, frequency monitor 5100 and frequency monitor 5300 utilize a GPS PPS signal to measure the output frequencies of oscillator 5200 and oscillator 5000.

Frequency monitor 5100 and frequency monitor 5300 can be, but need not be, structurally and functionally identical to frequency monitor 1100 and frequency monitor 1300 of receiver chain 100. Accordingly, in one embodiment, frequency monitor 5100 and frequency monitor 5300 may be simple counters, as described in detail above, that start and stop measuring the number of clock signals generated by oscillator 5200 and oscillator 5000 using the GPS PPS signal received from GPS receiver 1500. In another embodiment, frequency monitor 5100 and frequency monitor 5300 can be continuously running counters, as described in detail above, that capture successive readings of the number of clock signals generated by oscillator 5200 and oscillator 5000 when the PPS signal from GPS receiver 1500 is received. As with frequency monitor 1100 and frequency monitor 1300 in receiver chain 100, various other methods for directly counting the clock signals generated by oscillator 5200 and oscillator 5000 also can be used.

As described above in the discussion of receiver chain 100, a single frequency monitor can be used to measure the frequencies of oscillator 5200 and oscillator 5000 using the same sampling technique described above (this embodiment is not shown). Alternatively, and as described above in the discussion of receiver chain 100, this sampling technique can also be employed using both frequency monitor 5100 and frequency monitor 5300. In another embodiment of the present invention, a single frequency monitor can be used to measure the frequency of all oscillators used in both receiver chain 100 and transmitter chain 200 using the above described sampling technique.

In a preferred embodiment of the present invention, frequency monitor 5100 and frequency monitor 5300 are V20 chips available from General Dynamics Information Systems, 8800 Queen Avenue South, Bloomington, Minn. 55431. Alternatively, frequency monitor 5100 and frequency monitor 5300 can be counter timer chips available from Intel Corp. or any other counter timer device, as would be known to those skilled in the art.

In one embodiment of the present invention (not shown), a first oscillator (not shown) can be used to function as both oscillator 1000 and oscillator 5000, and a second oscillator (not shown) can be used to function as oscillator 1200 and oscillator 5200. If desired, a single frequency monitor could be used to measure the frequency of each oscillator present in this embodiment.

In a preferred embodiment of the invention, the same GPS receiver 1500 is used in both receiver chain 100 and transmitter chain 200. In another embodiment (not shown), separate GPS receivers may be used in receiver chain 100 and transmitter chain 200. In yet another embodiment, separate GPS receivers (not shown) may be used for each individual frequency monitor.

E. Computer

The frequency measurements collected by frequency monitor 5100 and frequency monitor 5300 preferably are transmitted to computer 1400. Using these frequency measurements, computer 1400 preferably calculates the frequency errors of oscillator 5200 and oscillator 5000, calculates the resulting error in the mixing frequency generated in upconverter 7000, and solves for the frequency setting of NCO 6100 that is needed to provide a desired radio channel center frequency that is transmitted from upconverter 7000. As shown in FIGS. 3A and 3B, computer 1400 preferably is the same computer 1400 used in receiver chain 100 because the functions of computer 1400 are identical in receiver chain 100 and transmitter chain 200. In another embodiment of the present invention, a separate computer (not shown) may be used as computer 1400 in transmitter chain 200.

In the present invention, any computer that is suitable for calculating the frequency errors of one or more oscillators, calculating the resulting error of the mixing frequency generated in upconverter 7000, and solving for the frequency setting of NCO 6100 that is needed to provide a desired radio channel center frequency that is transmitted from upconverter 7000 may be used as computer 1400. In addition, computer 1400 may be physically located anywhere in the present invention. In a preferred embodiment of the present invention, the V20 chip available from General Dynamics Information Systems is used as computer 1400. In this embodiment, frequency monitor 5100, frequency monitor 5300, and frequency monitor 1100 and frequency monitor 1300 from receiver chain 100, or any combination thereof, can be incorporated into a single component along with computer 1400 because the V20 chip can contain all of these components and operate in accordance with the present invention.

Whereas the present invention has been described with respect to specific embodiments thereof, it will be understood that various changes and modifications will be suggested to one skilled in the art and it is intended that the invention encompass such changes and modifications as fall within the scope of the appended claims.

What is claimed is:

1. An apparatus for digitally compensating received radio frequency signals, comprising:
   a first oscillator;
   a downconverter for receiving the received radio frequency signals, the downconverter being driven by the first oscillator and having a mixer;
   a first frequency monitor adapted to measure the frequency of the first oscillator;
   a second oscillator;
   an analog-to-digital converter driven by the second oscillator;
   a digital receiver driven by the second oscillator, the digital receiver having a numerically controlled oscillator;
   a second frequency monitor adapted to measure the frequency of the second oscillator;
   a digital demodulator; and
   a computer adapted to receive the frequency measurement of the first oscillator from the first frequency monitor, to receive the frequency measurement of the second oscillator from the second frequency monitor, to calculate the errors of the first oscillator and the second oscillator, and to calculate a numerically controlled oscillator setting based on the calculation of the errors of the first oscillator and the second oscillator;
   wherein the numerically controlled oscillator is adapted to receive the numerically controlled oscillator setting from the computer to cause the digital receiver to transmit a signal of a desired frequency to the digital demodulator.

2. The apparatus of claim 1 further comprising:
an antenna, the antenna being electrically coupled to the downconverter.

3. The apparatus of claim 1 wherein the downconverter is configured to output a frequency band that is configured to contain a plurality of radio channels.

4. The apparatus of claim 1, wherein the digital receiver is configured to select a radio channel from a plurality of radio channels.

5. The apparatus of claim 1, wherein the radio frequency signals are GPS signals.

6. An apparatus for digitally compensating transmitted radio frequency signals, comprising:
a first oscillator;
a digital modulator having a numerically controlled oscillator and a mixer, wherein the digital modulator and the numerically controlled oscillator are driven by the first oscillator;
a first frequency monitor that is adapted to measure the frequency of the first oscillator;
a digital to analog converter driven by the first oscillator;
a second oscillator;
an upconverter driven by the second oscillator;
a second frequency monitor adapted to measure the frequency of the second oscillator;
a computer adapted to receive the frequency measurement of the first oscillator from the first frequency monitor, to receive the frequency measurement of the second oscillator from the second frequency monitor, to calculate the errors of the first oscillator and the second oscillator, and to calculate a numerically controlled oscillator setting based on the calculation of the errors of the first oscillator and the second oscillator;
wherein the numerically controlled oscillator is adapted to receive the numerically controlled oscillator setting from the computer to cause said upconverter to transmit a radio frequency signal of a desired frequency.

7. The apparatus of claim 6 further comprising:
an antenna, the antenna being electrically coupled to the upconverter.

8. The apparatus of claim 6, wherein the numerically controlled oscillator is configured to receive a frequency setting from the computer to compensate for inaccuracies of the oscillator.

9. The apparatus of claim 6, wherein the digital modulator is configured to output a digital intermediate frequency to the digital to analog converter, and the digital to analog converter is configured to convert the digital intermediate frequency to an analog signal.

10. The apparatus of claim 6, wherein the upconverter is configured to receive an analog signal from the digital to analog converter, the upconverter being configured to upconvert the analog signal to a desired transmission frequency.

11. The apparatus of claim 6, wherein the radio frequencies are GPS radio frequencies.

* * * * *